(12) United States Patent
Moore

(10) Patent No.: US 6,462,402 B2
(45) Date of Patent: Oct. 8, 2002

(54) MICROELECTRONIC SUBSTRATE COMPRISED OF ETCH STOP LAYER, STIFFENING LAYER, AND ENDPOINTING LAYER

(75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/778,318

(22) Filed: Feb. 6, 2001

(65) Prior Publication Data

US 2001/0017401 A1 Aug. 30, 2001

Related U.S. Application Data

(63) Continuation of application No. 09/182,111, filed on Oct. 27, 1998, now Pat. No. 6,184,571.

(51) Int. Cl.[7] .......................................... H01L 21/304
(52) U.S. Cl. .................. 257/635; 257/634; 257/636; 257/637; 257/638
(58) Field of Search ...................... 257/634–638, 257/692, 752, 915; 438/634, 692–693, 424–425

(56) References Cited

U.S. PATENT DOCUMENTS

| 4,514,437 A | * | 4/1985 | Nath ........................... 427/566 |
| 4,793,895 A | | 12/1988 | Kaanta et al. ................ 156/627 |
| 5,036,015 A | | 7/1991 | Sandhu et al. .................. 437/8 |
| 5,318,663 A | | 6/1994 | Buti et al. .................... 438/404 |
| 5,321,301 A | | 6/1994 | Rostoker ..................... 257/621 |
| 5,358,892 A | | 10/1994 | Rolfson ........................ 437/70 |
| 5,559,428 A | | 9/1996 | Li et al. ......................... 324/71 |
| 5,968,842 A | | 10/1999 | Hsiao .......................... 438/692 |
| 6,037,237 A | | 3/2000 | Park et al. .................... 438/424 |
| 6,048,775 A | | 4/2000 | Yao et al. ..................... 438/427 |
| 6,051,500 A | * | 4/2000 | Maury et al. ................ 438/692 |
| 6,074,517 A | | 6/2000 | Taravade ..................... 156/345 |
| 6,080,670 A | | 6/2000 | Miller et al. ................. 438/691 |
| 6,117,748 A | * | 9/2000 | Lou et al. .................... 438/400 |
| 6,199,259 B1 | * | 3/2001 | Demaray et al. ............. 29/458 |

FOREIGN PATENT DOCUMENTS

JP 10135319 A * 5/1998

OTHER PUBLICATIONS

Vachet, Guy and Michael Young "Critical dimension atomic force microscopy for 0.25–$\mu m$ process development", SolidState 38(12):57–62, Dec. 1994.

* cited by examiner

Primary Examiner—Nathan J. Flynn
Assistant Examiner—Thomas L. Dickey
(74) Attorney, Agent, or Firm—Dorsey & Whitney LLP

(57) ABSTRACT

A method and apparatus for endpointing a planarization process of a microelectronic substrate. In one embodiment, the microelectronic substrate can include a semiconductor base, a first material, such as an oxide, disposed on the base, a second material, such as a nitride, disposed on the first material to stiffen the first material, and an endpointing material, such as polysilicon, disposed on the second material. The endpointing material can have a hardness and/or a fracture resistance that is less than a hardness and/or a fracture resistance of the stiffening material and, in one embodiment, can have a coefficient of friction that is different than surrounding material of the microelectronic substrate so as to be detected when exposed to a planarizing medium.

26 Claims, 4 Drawing Sheets

US 6,462,402 B2

1

MICROELECTRONIC SUBSTRATE COMPRISED OF ETCH STOP LAYER, STIFFENING LAYER, AND ENDPOINTING LAYER

This application is a continuation of U.S. patent application Ser. No. 09/182,111, filed Oct. 27, 1998, now U.S. Pat. No. 6,184,571.

TECHNICAL FIELD

The present invention relates to methods and apparatuses for endpointing a planarization process of a microelectronic substrate.

BACKGROUND OF THE INVENTION

Mechanical and chemical-mechanical planarization processes (collectively "CMP") are used in the manufacturing of microelectronic devices for forming a flat surface on semiconductor wafers, field emission displays and many other microelectronic substrates. FIG. 1 schematically illustrates a planarizing machine 10 with a platen or table 20, a carrier assembly 30 above the platen 20, a polishing pad 21 on the platen 20, and a planarizing fluid 23 on the polishing pad 21. The planarizing machine 10 may also have an under-pad 25 attached to an upper surface 22 of the platen 20 for supporting the polishing pad 21. In many planarizing machines, a platen drive assembly 26 rotates (arrow A) and/or reciprocates (arrow B) the platen 20 to move the polishing pad 21 during planarization.

The carrier assembly 30 controls and protects a substrate 80 during planarization. The carrier assembly 30 typically has a substrate holder 32 with a pad 34 that holds the substrate 80 via suction. A carrier drive assembly 36 typically rotates (arrow C) and/or translates (arrow D) the substrate holder 32. The substrate holder 32, however, may be a weighted, free-floating disk (not shown) that slides over the polishing pad 21.

The combination of the polishing pad 21 and the planarizing fluid 23 generally defines a planarizing medium 28 that mechanically and/or chemically mechanically removes material from the surface of the substrate 80. The polishing pad 21 may be a conventional polishing pad composed of polymeric material (e.g., polyurethane) without abrasive particles, or it may be an abrasive polishing pad with abrasive particles fixedly bonded to a suspension material. In a typical application, the planarizing fluid 23 may be a CMP slurry with abrasive particles and chemicals for use with a conventional, nonabrasive polishing pad. In other applications, the planarizing fluid 23 may be a chemical solution without abrasive particles for use with an abrasive polishing pad.

To planarize the substrate 80 with the planarizing machine 10, the carrier assembly 30 presses the substrate 80 against a planarizing surface 24 of the polishing pad 21 in the presence of the planarizing fluid 23. The platen 20 and/or the substrate holder 32 then move relative to one another to translate the substrate 80 across the planarizing surface 24. As a result, the abrasive particles and/or the chemicals in the planarizing medium 28 remove material from the surface of the substrate 80.

CMP processes must consistently and accurately produce a uniform, planar surface on the substrate to enable precise fabrication of circuits and photopatterns. Prior to being planarized, many substrates have large "step heights" that create a highly topographic surface across the substrate. Yet, as the density of integrated circuits increases, it is necessary that the substrate have a planar surface at several processing stages because non-uniform substrate surfaces significantly increase the difficulty of forming sub-micron features or photopatterns to within a tolerance of approximately 0.1 µm. Thus, CMP processes must typically transform a highly topographical substrate surface into a highly uniform, planar substrate surface (e.g., a "blanket surface").

In the competitive semiconductor industry, it is highly desirable to maximize the throughput of CMP processing by producing a blanket surface on a substrate as quickly as possible. The throughput of CMP processing is a function of several factors, one of which is the ability to accurately stop CMP processing at a desired endpoint. In a typical CMP process, the desired endpoint is reached when the surface of the substrate is a blanket surface and/or when enough material has been removed from the substrate to form discrete components on the substrate (e.g., shallow trench isolation areas, contacts, damascene lines, etc.). Accurately stopping CMP processing at a desired endpoint is important for maintaining a high throughput because the substrate may need to be re-polished if the substrate is "underplanarized." Accurately stopping CMP processing at the desired endpoint is also important because too much material can be removed from the substrate, and thus, the substrate may be "over-polished." For example, over-polishing can cause "dishing" in shallow-trench isolation structures, or over-polishing can completely destroy a section of the substrate. Thus, it is highly desirable to stop CMP processing at the desired endpoint.

In one conventional method of forming substrates with shallow-trench isolation structures, the substrate is etched to form shallow trenches between pads on which devices (such as transistors) are later formed. Each pad has a generally flat upper surface that forms initially sharp corners with the adjacent trenches to maximize the amount of surface area on the pad available for forming semiconductor devices. The pads generally include a pad oxide layer that is used as an etch stop for later processing, and the walls of the trenches are generally coated with a thermally-grown oxide layer.

One problem with the trench formation method discussed above is that the trench oxide layer may tend to "creep" between the pad and the pad oxide layer, rounding the edges of the pad and reducing the pad area available for forming devices. One approach to addressing this problem has been to apply a layer of nitride on top of the pad oxide to stiffen the pad oxide and reduce the tendency for the trench oxide layer to round the corners of the pads. The nitride layer can then be used to endpoint a subsequent planarization process and prevent planarization of the adjacent pad oxide layer. For example, the endpoint can be detected by sensing a change in friction between the substrate and the polishing medium when the polishing medium encounters the nitride layer. Detecting the endpoint by sensing such a change in friction is disclosed in U.S. Pat. No. 5,036,015.

One problem with the nitride layer is that it can be so hard and brittle that when it comes into contact with the planarizing medium the nitride fractures, creating chips or fragments. The nitride chips or fragments can become suspended in the planarizing liquid where they can scratch the surface of the substrate and/or otherwise damage the substrate. The damaged substrate must generally either be discarded or repaired, reducing the overall efficiency of the manufacturing operation.

Nitride has also been used outside the context of shallow-trench isolation structures in a process termed Local Oxidation of Silicon (LOCOS) to form active device regions on a silicon substrate. In one process, described in U.S. Pat. No. 5,358,892, a long "birds beak" oxidation region forms adjacent the active device region and can encroach into the active device region. The process can accordingly include disposing a nitride layer in the active device region to reduce encroachment by the bird's beak, and disposing a polysilicon layer between the nitride layer and the active device region to provide stress relief. The polysilicon and nitride layers are later etched away.

SUMMARY OF THE INVENTION

The present invention is directed toward methods and apparatuses for endpointing a planarizing process of a microelectronic substrate. In one aspect of the invention, the microelectronic substrate can include a semiconductor material having a first surface and a second surface opposite the first surface. The first surface can include a component region and at least one isolating region adjacent the component region. The isolating region and the component region can be located at different distances from the second surface of the semiconductor material, and the isolating region can include a generally sharp corner where it intersects the component region. The microelectronic substrate can further include a first material, such as an oxide, disposed on the first surface of the semiconductor material, a second material, such as a nitride, disposed on the first material to stiffen the first material, and an endpointing material, such as polysilicon, disposed on the second material. The endpointing material can have a hardness that is less than a hardness of the second material.

During planarization, material can be removed from the microelectronic substrate until the endpointing material is detected. In response to detecting removal of the endpointing material, planarization of the microelectronic substrate can be halted by halting relative movement between the microelectronic substrate and a planarizing medium adjacent the microelectronic substrate. In one aspect of this embodiment, detecting removal of the endpointing material can include detecting a change in friction between the microelectronic substrate and the planarizing medium adjacent the microelectronic substrate when the endpointing material contacts the planarizing medium.

DETAILED DESCRIPTION OF THE INVENTION

The present invention is directed toward methods and apparatuses for endpointing the planarization of a microelectronic substrate. The microelectronic substrate can include a series of isolating trenches that separate semiconductor device pads. Each pad can include an etch stop layer and a relatively hard stiffening layer upon which is positioned a softer endpointing layer. Many specific details of certain embodiments of the invention are set forth in the following description and in FIGS. 2A–4B to provide a thorough understanding of such embodiments. One skilled in the art, however, will understand that the present invention can have several embodiments and that they can be practiced without several of the details described in the following description.

Figure 1:
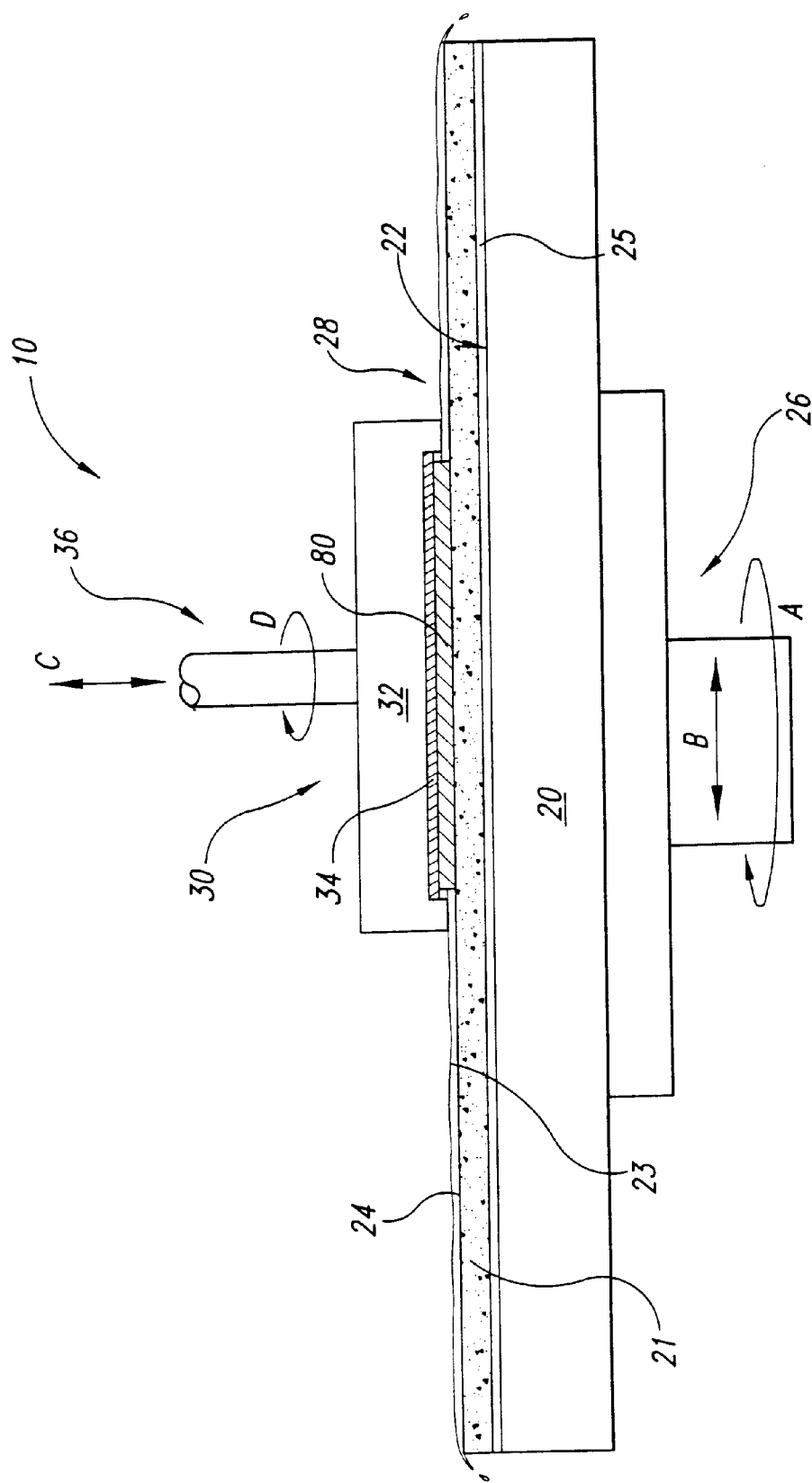
FIG. 1 is a partial cross-sectional elevation view of a chemical-mechanical planarization machine in accordance with the prior art.
Figure 2A:
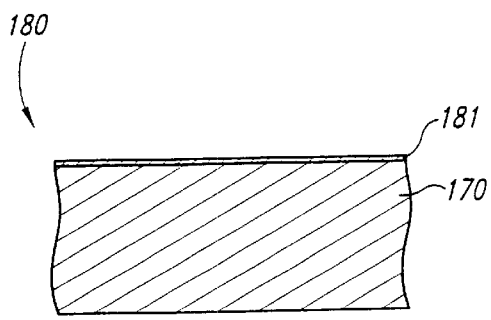
FIG. 2A is a cross-sectional elevation view of a portion of a microelectronic substrate having an etch stop layer in accordance with an embodiment of the present invention.

FIG. 2A is a cross-sectional elevation view of a portion of a microelectronic substrate 180 in accordance with an embodiment of the present invention. The microelectronic substrate 180 can include a semiconductor base 170 that can be formed from silicon or another suitable semiconductor material. The base 170 can include an etch stop layer 181 disposed on one surface of the base 170. For purposes of illustration, the thickness of the etch stop layer 181 shown in FIG. 2A (and the thickness of additional layers discussed below with respect to FIGS. 2B–2H) may be exaggerated relative to the thickness of the base 170 and other layers. In one embodiment, the etch stop layer 181 can include an oxide that is "grown" from the material forming the base 170 to a thickness of approximately 60 Å. In other embodiments, the etch stop layer 181 can include other materials and/or can have other thicknesses that are sufficient to form a barrier to etchants used for processing the microelectronic substrate 180, as will be discussed in greater detail below.

Figure 2B:
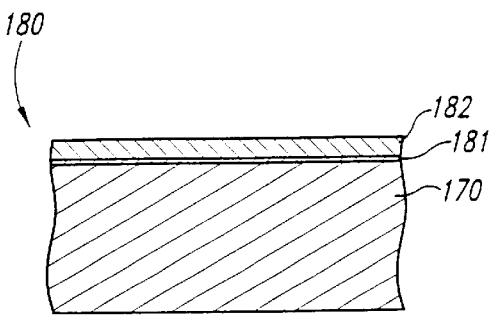
FIG. 2B is a cross-sectional elevation view of the microelectronic substrate of FIG. 2A having a stiffening layer applied to the etch stop layer.

As shown in cross-section in FIG. 2B, a stiffening layer 182 can be disposed on the etch stop layer 181 to stiffen the etch stop layer 181. In one embodiment, the stiffening layer 182 can include nitride or a nitride compound, such as silicon nitride or boron nitride. In other embodiments, the stiffening layer 182 can include other materials that, when disposed on the etch stop layer 181, stiffen the etch stop layer 181 to restrict bending or other deformations of the etch stop layer 181. Suitable alternate materials for the stiffening layer 182 include, for example, tantalum pentoxide and indium tin oxide. The stiffening layer 182 can be deposited on the etch stop layer 181 using techniques such as low pressure chemical vapor deposition or plasma-enhanced chemical vapor deposition. In one embodiment, the stiffening layer 182 can have a thickness of between approximately 20 nm and approximately 200 nm, and in a particular aspect of this embodiment, the stiffening layer 182 can have a thickness of approximately 120 nm.

Figure 2C:
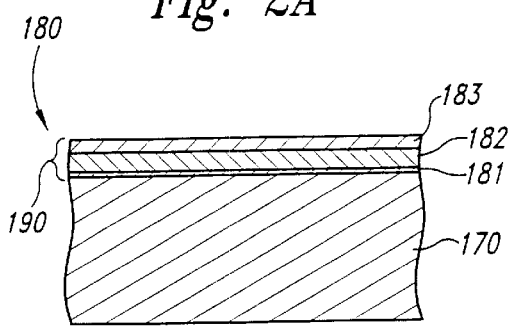
FIG. 2C is a cross-sectional elevation view of the microelectronic substrate of FIG. 2B having an endpointing layer applied to the stiffening layer.

As shown in FIG. 2C, an endpointing layer 183 can be disposed on the stiffening layer 182 to mark a location adjacent to the stiffening layer 182 at which to halt a subsequent planarization operation. As will be discussed in greater detail below, one characteristic of an embodiment of the endpointing layer 183 is that it can have a coefficient of friction that is different than a coefficient of friction of the surrounding materials so that it can easily be detected by a planarization machine. As will also be discussed in greater detail below, another characteristic of an embodiment of the endpointing layer 183 is that it can be softer than the stiffening layer 182. For example, in one embodiment where the stiffening layer 182 includes nitride, the endpointing layer 183 can include polysilicon. In other embodiments, the endpointing layer 183 can include other materials, such as tungsten nitride, titanium nitride or other substances having the desired coefficient of friction and hardness characteristics discussed above. In any of the foregoing embodiments, the endpointing layer 183 can be deposited by low pressure chemical-vapor deposition, plasma-enhanced chemical vapor deposition, or other suitable techniques.

As is also shown in FIG. 2C, the etch stop layer 181, the stiffening layer 182 and the endpointing layer 183 together define a stack 190 atop the base 170. In one embodiment, the endpointing layer 183 can include polysilicon having a thickness in the range of between 10% and 90% of the thickness of the entire stack 190. In other embodiments, the amount of polysilicon (or other material forming the endpointing layer 183) can have other values. For example, in one embodiment, the endpointing layer 183 can have a thickness in the range of approximately 5 nm to approximately 50 nm.

Figure 2D:
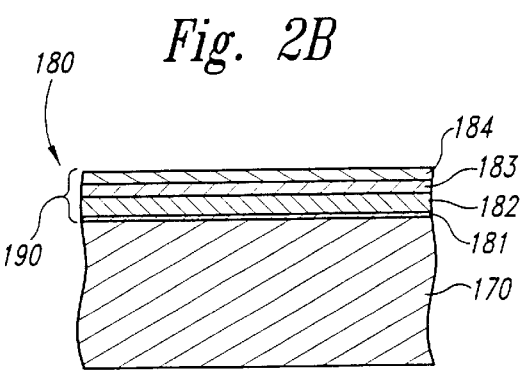
FIG. 2D is a cross-sectional elevation view of the microelectronic substrate of FIG. 2C having a photoresist layer applied to the endpointing layer.
Figure 2E:
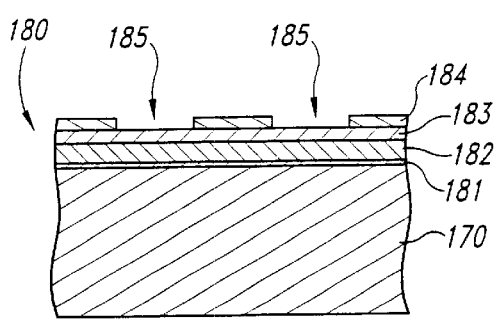
FIG. 2E is a cross-sectional elevation view of the microelectronic substrate of FIG. 2D with the photoresist layer partially removed.
Figure 2F:
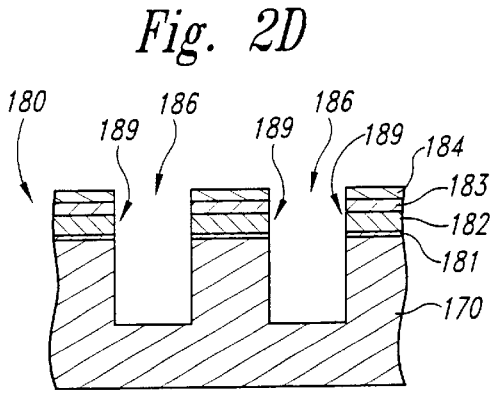
FIG. 2F is a cross-sectional elevation view of the microelectronic substrate of FIG. 2E having trenches etched between pads.

To form isolating trenches in the microelectronic substrate 180, the stack 190 is first covered with a photoresist layer 184, as shown in FIG. 2D. The photoresist layer 184 is selectively exposed to a selected radiation and rinsed to leave gaps 185 corresponding to the locations of the trenches, as shown in FIG. 2E. The microelectronic substrate 180 can then be dry etched to remove portions of the endpointing layer 183, the stiffening layer 182, the etch stop layer 181, and a portion of the base material 170 beneath the gaps 185 to form trenches 186 between raised pads 189, as shown in FIG. 2F. In one embodiment, the trenches can have a depth of approximately 2500 Å relative to the upper surface of the pad material 170, and a width of approximately 2000 Å. In alternate embodiments, other arrangements are possible as well. For example, the pads 189 can be recessed and separated by elevated isolation regions or the pads and the isolation regions can be at the same elevation, so long as neighboring pads are electrically isolated from each other by the intermediate isolation regions.

Figure 2G:
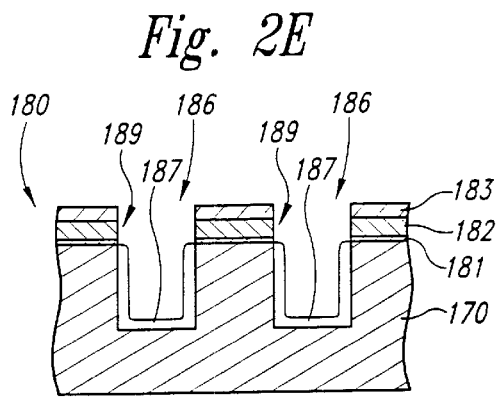
FIG. 2G is a cross-sectional elevation view of the microelectronic substrate of FIG. 2F having thermal oxide layers applied to the trenches.

Once the pads 189 and the trenches 186 are formed, the remaining photoresist layer 184 can be removed. In one embodiment, a thermal oxide layer 187 is then formed on the walls of the trenches 186, as is shown in FIG. 2G. The thermal oxide layer 187 can repair damage sustained by the base material 170 in the region of the trenches 186 during the etch process. In one aspect of the embodiment, the thermal oxide layer 187 can have a thickness of approximately 150 Å.

In one embodiment, the thermal oxide layer 187 can be formed by exposing the microelectronic substrate 180 to oxygen, allowing the base material 170 to oxidize. The presence of the stiffening layer 182 can reduce the tendency for the thermal oxide layer 187 to grow into the raised pad 189 where it can reduce the effective surface area of the raised pad 189. For example, the stiffening layer 182 can act as a barrier to oxygen, which could otherwise diffuse through the etch stop layer 181 and oxidize the base material 170 in the region of the raised pad 189. Alternatively and/or in addition to blocking oxygen diffusion, the stiffening layer 182 can add rigidity to the etch stop layer 181. For example, the base material 170 at the edges of the raised pad 189 tends to expand upwardly as it oxidizes, causing the etch stop layer 181 to bow upwardly at the outer edges thereof. The stiffening layer 182, which can be firmly attached to the etch stop layer 181, can resist the tendency of the etch stop layer 181 to bow upwardly, thereby resisting the ability of the base material 170 to oxidize in this region, which in turn reduces the lateral growth of the thermal oxide layer 187 into the raised pad 189.

Figure 2H:
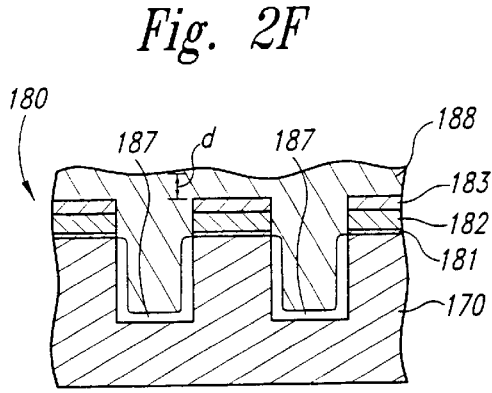
FIG. 2H is a cross-sectional elevation view of the microelectronic substrate of FIG. 2G having oxide applied to the pads and the trenches.

The trenches 186 and the pads 189 can then be covered with a deposited oxide layer 188, as shown in FIG. 2H. The deposited oxide layer 188 can have a "wavy" structure, due to the presence of the trenches 186 (FIG. 2G). In one embodiment, the deposited oxide layer 188 is deposited thickly enough that the troughs of the deposited oxide layer 188 are maintained at or above the top of the endpointing layer 183. In one aspect of this embodiment, a distance d between the troughs and the top of the endpointing layer can be in the range of between 2,000 Å and 5,000 Å.

Figure 3:
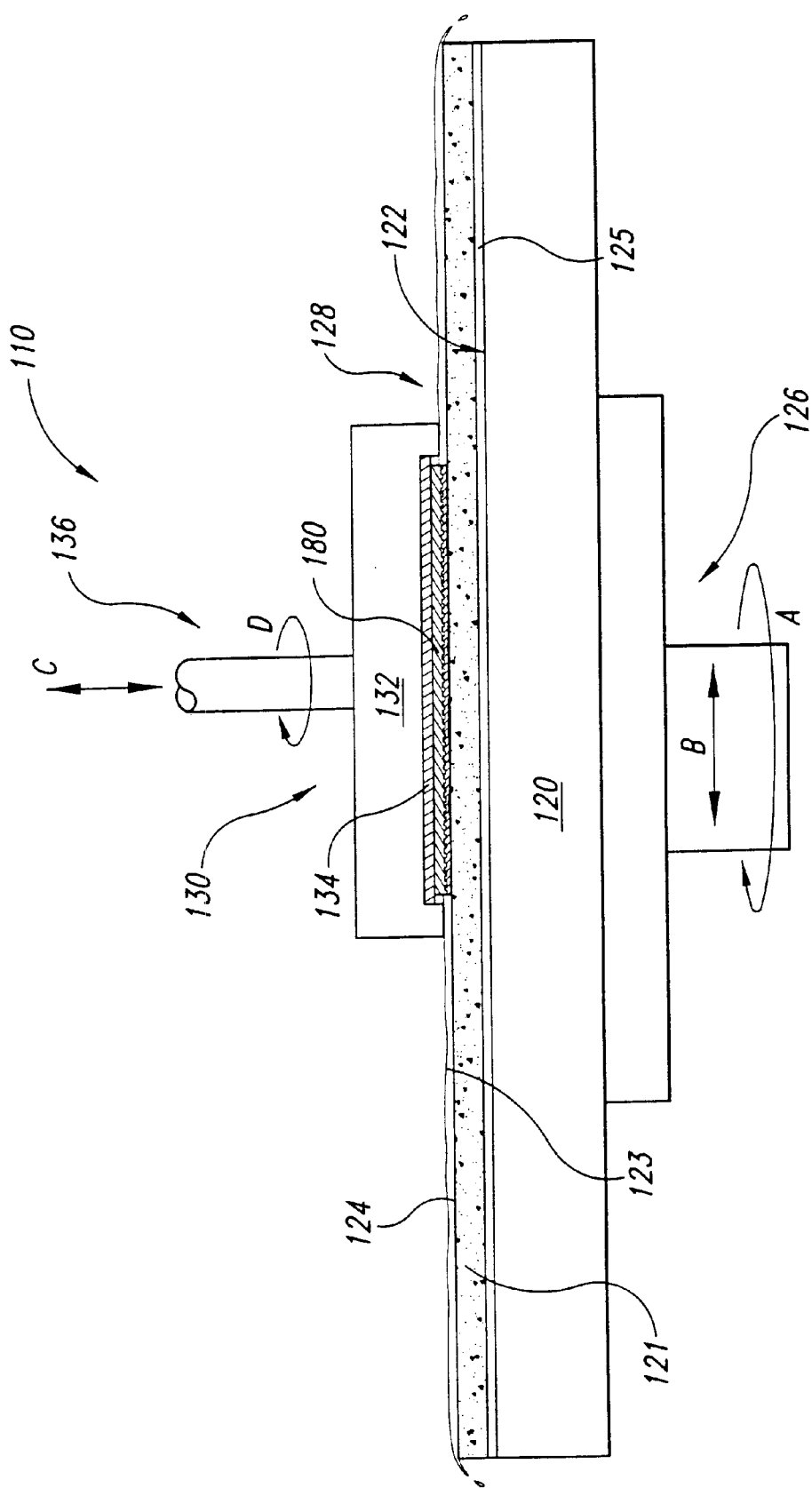
FIG. 3 is a partial cross-sectional elevation view of a chemical-mechanical planarization machine and microelectronic substrate in accordance with an embodiment of the present invention.

The wavy structure of the deposited oxide layer 188 is unsuitable for the precise formation of very small circuit devices on the pads 189 and accordingly, planarization is used to form a blanket surface of the upper surface on the microelectronic substrate 180. FIG. 3 illustrates a CMP apparatus 110 having a platen 120 and a planarizing medium 128 for forming a blanket surface. In the embodiment shown in FIG. 3, the planarizing medium 128 includes a polishing pad 121 releasably attached to the platen 120, and a planarizing fluid 123 disposed on a planarizing surface 124 of the polishing pad 121. The platen 120 can be movable by means of a platen drive assembly 126 that can impart rotational motion (indicated by arrow A) and/or translational motion (indicated by arrow B) to the platen 120. As was discussed above, the CMP apparatus 110 can also include a carrier assembly 130 having a substrate holder 132 and a resilient pad 134 that together press the microelectronic substrate 180 against the planarizing surface 124 of the polishing pad 121. A carrier drive assembly 136 can be coupled to the carrier assembly 130 to move the carrier assembly 130 axially (indicated by arrow C) and/or rotationally (indicated by arrow D) relative to the platen 120.

Figure 4A:
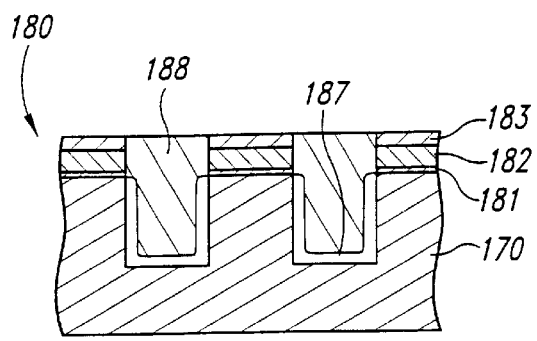
FIG. 4A is a cross-sectional elevation view of the microelectronic substrate shown in FIG. 2H after planarization.

As planarization begins, material is removed from the deposited oxide layer 188 (FIG. 2H) as a result of contact between the deposited oxide layer 188 and the planarizing medium 128. In one embodiment, the microelectronic substrate 180 is planarized until the endpointing layer 183 is exposed, as is shown in FIG. 4A. At this point, the frictional forces between the microelectronic substrate 180 and the planarizing apparatus 110 (FIG. 3) change as the endpointing material 183 begins to contact the planarizing medium 128. For example, when the endpointing layer 183 includes polysilicon (which has a friction coefficient that is greater than the friction coefficient of the surrounding deposited oxide layer 188), the frictional forces increase. In another embodiment, the frictional forces can decrease, depending on the relative values of the friction coefficients of the endpointing layer 183 and the deposited oxide layer 188. In either case, the planarizing process can be halted upon detecting the change in frictional forces due to exposing the endpointing layer 183.

In still further embodiments, the endpointing layer 183 can have characteristics other than the friction coefficient and hardness characteristics discussed above. For example, the endpointing layer 183 can have any characteristic that allows it to be detected during planarization before the stiffening layer 182 is exposed. Alternatively, the endpointing layer 183 need not be detected prior to exposing the stiffening layer 182, so long as other means (such as timing the planarization process) are used to halt planarization of the microelectronic substrate 180 before the stiffening layer 182 is exposed. Still further, the endpointing layer 183 need not be softer than the stiffening layer 182 so long as it has a lesser tendency than the stiffening layer 182 to fracture or chip upon contacting the planarizing medium 128, and/or reduces the tendency for the stiffening layer 182 itself to fracture or chip.

Figure 4B:
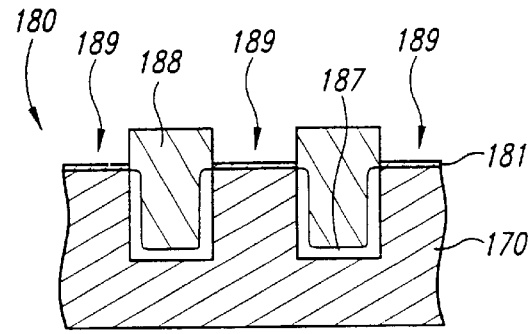
FIG. 4B is a cross-sectional elevation view of the microelectronic substrate shown in FIG. 4A after the endpointing and stiffening layers have been removed.

Once the planarization process is stopped, the stiffening layer 182 and any remaining portion of the endpointing layer 183 can be removed, for example, with an etch process, leaving the etch stop layer 181 on the pads 189 and the deposited oxide 188 in between the pads 189, as is shown in FIG. 4B. Semiconductor devices such as transistors can then be constructed on the pads 189 using a variety of known techniques, such as deposition and etching. The portion of the deposited oxide 188 projecting above the pads 189 can be removed incidentally as the semiconductor devices are constructed, or in a separate operation.

One feature of an embodiment of the CMP machine 110 and the microelectronic substrate 180 discussed above with reference to FIGS. 2A–4B is that the endpointing layer 183 can be softer than the adjacent stiffening layer 182. Accordingly, the endpointing layer 183 can absorb at least some of the lateral and vertical forces transmitted from the CMP machine 110 to the microelectronic substrate 180 during planarization, reducing the likelihood that these forces will be borne by the stiffening layer 182. This can be advantageous because it can reduce the likelihood that the stiffening layer 182 will chip or fracture during planarization, thereby reducing the likelihood of scratching or otherwise damaging the microelectronic substrate 180 with fractured portions of the stiffening layer 182.

Another feature is that the planarization can continue for some time after the endpointing layer 183 is first exposed. This can be advantageous because the time that elapses between first detecting the endpointing layer 183 and halting planarization need not be as accurately controlled as if the stiffening layer 182 alone (i.e., without the adjacent endpointing layer 183) were present on the microelectronic substrate 180. For example, in some conventional methods which do not in include forming the endpointing layer 183, planarization must be halted immediately upon detecting the stiffening layer 182 to reduce the likelihood of fracturing the stiffening layer 182. By contrast, with the endpointing layer 183 in place, some time is available to halt the planarizing process after first exposing the endpointing layer 183.

Yet another feature of an embodiment of the present invention is that unlike some conventional methods, it can be independent of the planarization rate. For example, in some conventional methods, the endpoint is estimated by estimating a thickness of material to be removed from the microelectronic substrate, estimating the planarization rate, and halting planarization when the product of the planarization rate and the elapsed planarization time approximates the thickness to be removed. This conventional method can be subject to significant error, for example, when the planarization rate changes due to variations in the material properties of the microelectronic substrate 180. By contrast, a method in accordance with an embodiment of the present invention can be independent of both the planarization rate and the expected thickness of material removed from the microelectronic substrate 180.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic substrate, comprising:
   a semiconductor material having a first surface and a second surface opposite the first surface, the first surface having a device region and at least one isolating region adjacent the device region, semiconductor material being removed from at least one of the device region and the isolating region so that the device region and the isolating region are located at different distances from the second surface of the semiconductor material;
   an etch stop layer disposed on the device region of the semiconductor material;
   a stiffening layer disposed on the etch stop layer to restrict deformation of the etch stop layer; and
   an endpointing layer disposed on the stiffening layer, the endpointing layer having a hardness that is less than a hardness of the stiffening layer.

2. The microelectronic substrate of claim 1 wherein the endpointing layer comprises polysilicon.

3. The microelectronic substrate of claim 1 wherein the stiffening layer comprises a nitride compound.

4. The microelectronic substrate of claim 3 wherein the nitride compound is silicon nitride.

5. The microelectronic substrate of claim 1 wherein the stiffening layer comprises a compound selected from the group consisting of tantulum pentoxide, indium and tin oxide.

6. The microelectronic substrate of claim 1 wherein the endpointing layer is polysilicon and the stiffening layer is a nitride compound.

7. The microelectronic substrate of claim 6 wherein the nitride compound is silicon nitride.

8. The microelectronic substrate of claim 1, further comprising an isolating material in the isolating region, the isolating material having a different coefficient of friction than the endpointing material.

9. The microelectronic substrate of claim 1 wherein the isolating region includes a trench recessed below the first surface of the semiconductor material.

10. The microelectronic substrate of claim 1 further comprising a thermal oxide layer deposited in the isolating regions.

11. A microelectronic substrate, comprising:
    a semiconductor material having a first surface and a second surface opposite the first surface, the first surface having a device region and at least one isolating region adjacent the device region, semiconductor material being removed from at least one of the device region and the isolating region so that the device region and the isolating region are located at different distances from the second surface of the semiconductor material;
    an etch stop layer disposed on the device region of the semiconductor material;
    a stiffening layer disposed on the etch stop layer to restrict deformation of the etch stop layer;

an endpointing layer disposed on the stiffening layer, the endpointing layer having a hardness that is less than a hardness of the stiffening layer; and a fourth layer deposited over the endpointing layer, the fourth layer having a coefficient of friction that differs from the endpointing layer.

12. The microelectronic substrate of claim 11 wherein the endpointing layer comprises polysilicon.

13. The microelectronic substrate of claim 11 wherein the stiffening layer comprises a nitride compound.

14. The microelectronic substrate of claim 13 wherein the nitride compound is silicon nitride.

15. The microelectronic substrate of claim 11 wherein the stiffening layer comprises a compound selected from the group consisting of tantulum pentoxide, indium and tin oxide.

16. The microelectronic substrate of claim 11 wherein the endpointing layer is polysilicon and stiffening layer is a nitride compound.

17. The microelectronic substrate of claim 16 wherein the nitride compound is silicon nitride.

18. The microelectronic substrate of claim 11 wherein the isolating region includes a trench recessed below the first surface of the semiconductor material.

19. The microelectronic substrate of claim 11 further comprising an oxide layer deposited in the isolating regions.

20. A microelectronic substrate, comprising:

a semiconductor material having a first surface and a second surface opposite the first surface, the first surface having a first region and a second region located at different distances from the second surface of the semiconductor material, an etch stop layer disposed on the device region of the semiconductor material;

a stiffening layer disposed on the etch stop layer to restrict deformation of the etch stop layer;

an endpointing layer disposed on the stiffening layer, the endpointing layer having a hardness that is less than a hardness of the stiffening layer; and a thermal oxide layer disposed on the second region and not disposed on the first region.

21. The microelectronic substrate of claim 20 wherein the endpointing layer comprises polysilicon.

22. The microelectronic substrate of claim 20 wherein the stiffening layer comprises a nitride compound.

23. The microelectronic substrate of claim 22 wherein the nitride compound is silicon nitride.

24. The microelectronic substrate of claim 20 wherein the stiffening layer comprises a compound selected from the group consisting of tantulum pentoxide, indium and tin oxide.

25. The microelectronic substrate of claim 20 wherein the endpointing layer is polysilicon and the stiffening layer is a nitride compound.

26. The microelectronic substrate of claim 25 wherein the nitride compound is silicon nitride.

* * * * *